(12) United States Patent
Shinkai

(10) Patent No.: US 11,744,005 B2
(45) Date of Patent: Aug. 29, 2023

(54) ELECTRONIC COMPONENT MODULE AND MANUFACTURING METHOD OF ELECTRONIC COMPONENT MODULE

(71) Applicant: Murata Manufacturing Co., Ltd., Kyoto (JP)

(72) Inventor: Hideki Shinkai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 212 days.

(21) Appl. No.: 17/237,594

(22) Filed: Apr. 22, 2021

(65) Prior Publication Data
US 2021/0243887 A1    Aug. 5, 2021

Related U.S. Application Data

(63) Continuation of application No. PCT/JP2019/041526, filed on Oct. 23, 2019.

(30) Foreign Application Priority Data

Oct. 25, 2018    (JP) .................................. 2018-200597

(51) Int. Cl.
*H05K 1/02*     (2006.01)
*H01L 21/56*    (2006.01)
(Continued)

(52) U.S. Cl.
CPC ........... *H05K 1/0218* (2013.01); *H01L 21/56* (2013.01); *H01L 23/552* (2013.01); *H05K 3/284* (2013.01);
(Continued)

(58) Field of Classification Search
CPC ...... H05K 1/02; H05K 1/0216; H05K 1/0218; H05K 1/18; H05K 1/181–187;
(Continued)

(56) References Cited

U.S. PATENT DOCUMENTS

| 7,364,628 B2 * | 4/2008 | Kakimoto ............. H01F 1/0596 |
| | | 419/68 |
| 8,969,737 B2 * | 3/2015 | Just ...................... H05K 1/0218 |
| | | 361/818 |
| 10,431,554 B2 * | 10/2019 | Lin .......................... H01L 24/97 |
| 2002/0145902 A1 | 10/2002 | Kunikiyo et al. |

(Continued)

FOREIGN PATENT DOCUMENTS

| JP | 2002-290131 A | 10/2002 |
| JP | 4818519 B2 | 11/2011 |

(Continued)

OTHER PUBLICATIONS

International Search Report for International Patent Application No. PCT/JP2019/041526 dated Dec. 24, 2019.
Written Opinion for International Patent Application No. PCT/JP2019/041526 dated Dec. 24, 2019.

*Primary Examiner* — Tuan T Dinh
(74) *Attorney, Agent, or Firm* — Pearne & Gordon LLP

(57) ABSTRACT

An electronic component module includes a board, an electronic component, a sealing portion, a metal layer, and a magnetic layer. The board has a first main surface. The electronic component is provided on a first main surface of the board. The sealing portion seals the electronic component. The metal layer covers the sealing portion. The magnetic layer is provided between the sealing portion and the metal layer. The magnetic layer has a magnetic main body and a first cover sheet. The first cover sheet is provided between the magnetic main body and the metal layer. The first cover sheet has a first main surface and a second main surface. The first main surface faces the magnetic main body. The second main surface faces the metal layer. The second outer peripheral end of the second main surface is located inside the first outer peripheral end of the first main surface.

11 Claims, 7 Drawing Sheets

(51) Int. Cl.
*H01L 23/552* (2006.01)
*H05K 3/28* (2006.01)
*H05K 1/18* (2006.01)
*H05K 9/00* (2006.01)

(52) U.S. Cl.
CPC .......... *H05K 1/181* (2013.01); *H05K 9/0088* (2013.01); *H05K 2201/0715* (2013.01); *H05K 2201/08* (2013.01); *H05K 2201/10098* (2013.01); *H05K 2203/1322* (2013.01)

(58) Field of Classification Search
CPC ....... H05K 2201/0715; H05K 2201/08; H05K 2201/1322; H05K 2201/1083; H01L 21/56; H01L 21/561; H01L 23/552; H01L 23/3128
USPC ........ 361/760–764, 782–784, 794–795, 816, 361/818; 257/660–690, 730, 787–790; 174/260–264, 520
See application file for complete search history.

(56) References Cited

U.S. PATENT DOCUMENTS

| | | | |
|---|---|---|---|
| 2004/0075616 A1 | 4/2004 | Endo et al. | |
| 2005/0039935 A1* | 2/2005 | Kolb | H05K 9/0024 |
| | | | 174/350 |
| 2009/0166819 A1* | 7/2009 | Chen | H01L 23/552 |
| | | | 257/659 |
| 2014/0239464 A1* | 8/2014 | Chung | H01L 21/565 |
| | | | 257/659 |
| 2017/0278804 A1 | 9/2017 | Kawabata et al. | |
| 2017/0294387 A1 | 10/2017 | Kawabata et al. | |
| 2017/0309576 A1* | 10/2017 | Kawabata | H01L 25/16 |
| 2017/0323851 A1* | 11/2017 | Wei | H01L 23/5227 |
| 2018/0033738 A1* | 2/2018 | Kawabata | H01L 23/49838 |
| 2018/0204783 A1* | 7/2018 | Han | G06F 1/1656 |

FOREIGN PATENT DOCUMENTS

| | | |
|---|---|---|
| JP | 5988003 B1 | 9/2016 |
| JP | 5988004 B1 | 9/2016 |
| JP | 2017-174947 A | 9/2017 |

* cited by examiner

FIG. 6A
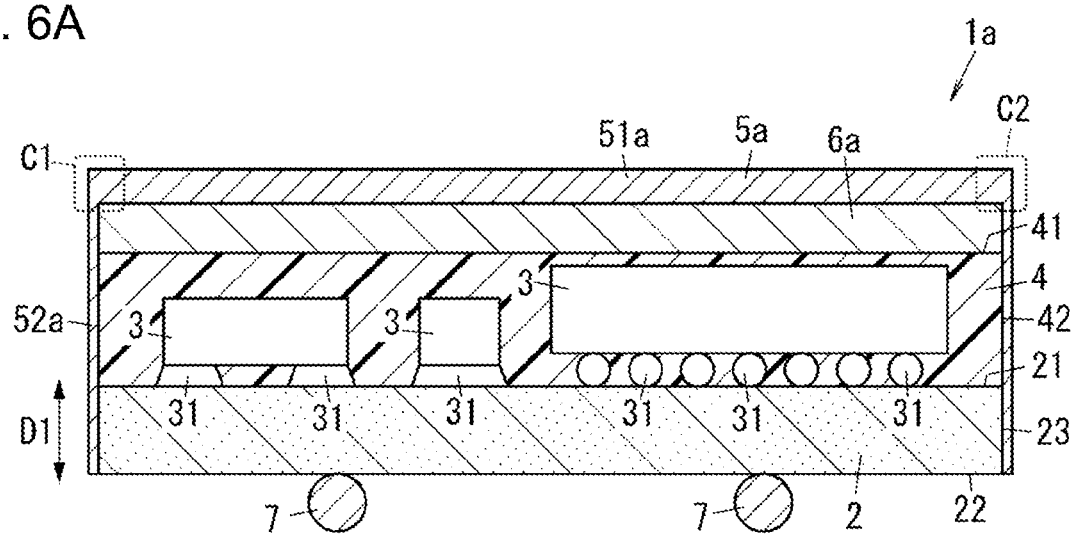
FIG. 6B
FIG. 6C
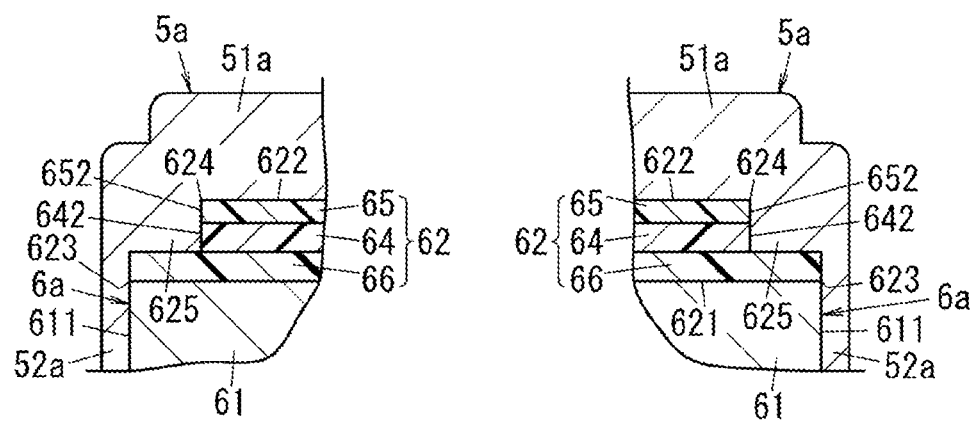
FIG. 7
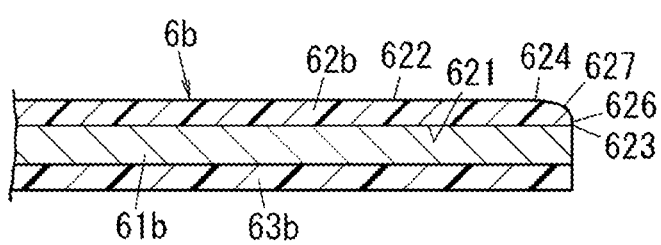

ELECTRONIC COMPONENT MODULE AND MANUFACTURING METHOD OF ELECTRONIC COMPONENT MODULE

CROSS REFERENCE TO RELATED APPLICATIONS

This is a continuation of International Application No. PCT/JP2019/041526 filed on Oct. 23, 2019 which claims priority from Japanese Patent Application No. 2018-200597 filed on Oct. 25, 2018. The contents of these applications are incorporated herein by reference in their entireties.

BACKGROUND OF THE DISCLOSURE

Field of the Disclosure

The present disclosure generally relates to an electronic component module and a method of manufacturing the electronic component module, and more specifically, an electronic component module having a magnetic layer and a metal layer, and a method of manufacturing the electronic component module.

Description of the Related Art

In the related art, a known electronic component module includes an electronic component module having a magnetic layer and a metal layer (see, for example, Patent Document 1).

The electronic circuit package (electronic component module) described in Patent Document 1 includes a board, a plurality of electronic components, a mold resin (sealing portion), a magnetic film (magnetic layer), and a metal film (metal layer). The plurality of electronic components is mounted on a board. The mold resin covers the main surface of the board so as to embed the plurality of electronic components. The magnetic film covers the mold resin. The metal film covers the magnetic film and the mold resin.
Patent Document 1: JP 5988003 B1

BRIEF SUMMARY OF THE DISCLOSURE

In the conventional electronic component module, a magnetic layer may have a structure in which a magnetic main body and a cover sheet are laminated. In this case, the cover sheet is provided toward the metal layer relative to the magnetic main body. In a case of using such a magnetic layer, when the magnetic layer is cut, burrs may be generated on the cover sheet at the periphery of the magnetic layer after cutting, and the side face of the cover sheet may protrude outward of the side face of the magnetic main body. When the side face of the cover sheet protrudes outward of the side face of the magnetic main body, the protruding part of the cover sheet is formed in an umbrella when providing a metal layer on a magnetic layer, making it difficult for the metal layer to be formed on the magnetic main body, so that the metal layer may be divided at the protruding part of the cover sheet. In other words, the protruding part of the cover sheet outward of the magnetic main body has a blocking part, and it is difficult for the metal layer to be formed at the blocking part, so that the metal layer is divided. Therefore, there is a problem that the shielding effect of the metal layer may be lowered.

The present disclosure is a disclosure made in view of the above points, and an object of the present disclosure is to provide an electronic component module capable of suppressing a decrease in the shielding effect of a metal layer and a method of manufacturing the electronic component module.

The electronic component module according to an aspect of the present disclosure includes a board, an electronic component, a sealing portion, a metal layer, and a magnetic layer. The board has a main surface. The electronic component is provided on the main surface of the board. The sealing portion seals the electronic component. The metal layer covers the sealing portion. The magnetic layer is provided between the sealing portion and the metal layer. The magnetic layer includes a magnetic main body and a cover sheet. The cover sheet is provided between the magnetic main body and the metal layer. The cover sheet has a first main surface and a second main surface. The first main surface faces the magnetic main body. The second main surface faces the metal layer. The outer peripheral end of the second main surface is located inside the outer peripheral end of the first main surface.

The method of manufacturing an electronic component module according to an aspect of the present disclosure includes preparing a board and providing electronic components on the board. The method of manufacturing the electronic component module includes providing a sealing portion that seals the electronic component and cutting the magnetic sheet to form the magnetic layer. The method of manufacturing an electronic component module includes providing the magnetic layer on at least part of the sealing portion. The method of manufacturing an electronic component module includes providing a metal layer so as to cover the sealing portion and the magnetic layer. The magnetic layer includes a magnetic main body and a cover sheet. The cover sheet is provided between the magnetic main body and the metal layer. The cover sheet has a first main surface and a second main surface. The first main surface faces the magnetic main body. The second main surface faces the metal layer. The forming of the magnetic layer includes cutting the magnetic sheet to form the magnetic layer so that the outer peripheral end of the second main surface is located inside the outer peripheral end of the first main surface.

According to the electronic component module and the method of manufacturing the electronic component module according to the above aspect of the present disclosure, it is possible to suppress a decrease in the shielding effect of the metal layer.

BRIEF DESCRIPTION OF THE SEVERAL VIEWS OF THE DRAWINGS

FIG. 6A is a cross-sectional view of the electronic component module according to the second modification of the first embodiment. FIG. 6B is an enlarged view of the region C1 of FIG. 6A in the electronic component module. FIG. 6C is an enlarged view of the region C2 of FIG. 6A in the electronic component module.

FIG. 7 is a cross-sectional view of a principal part of the magnetic layer in the electronic component module according to the second embodiment.

DETAILED DESCRIPTION OF THE DISCLOSURE

Hereinafter, the electronic component module and the method of manufacturing the electronic component module according to the first to third embodiments will be described with reference to the drawings. In the following embodiments and the like, each of the referenced figures is a schematic diagram, and the ratio of the size and thickness of each component in the figure does not always reflect the actual dimensional ratio.

First Embodiment (1) Overall Configuration of Electronic Component Module

The overall configuration of the electronic component module according to the first embodiment will be described with reference to the drawings.

Figure 1A:
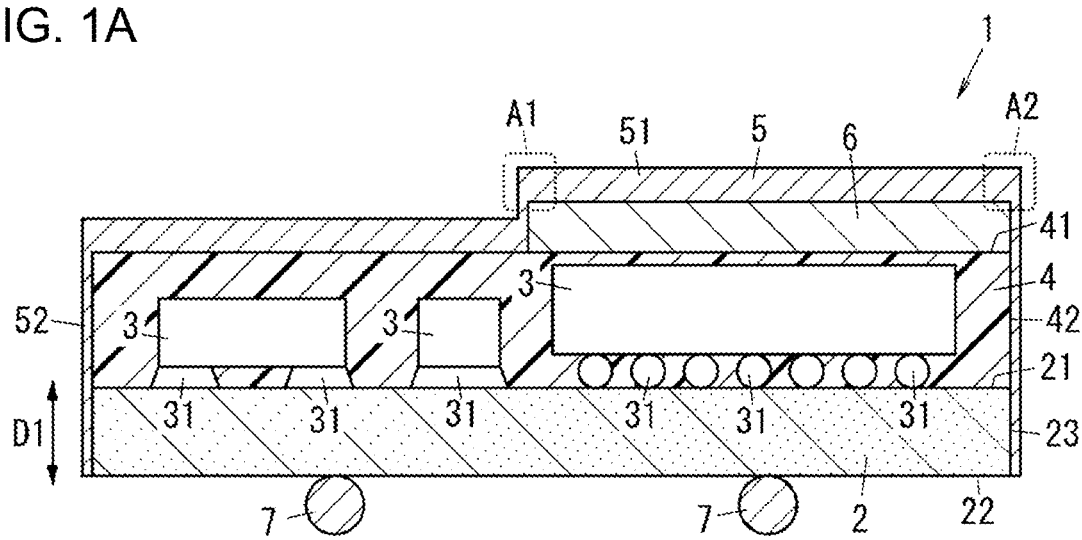
FIG. 1A is a cross-sectional view of an electronic component module according to the first embodiment.

As shown in FIG. 1A, an electronic component module 1 includes a board 2, a plurality of electronic components 3 (three in the illustrated example), a sealing portion 4, a metal layer 5, a magnetic layer 6, and a plurality of electrical connection portions 7 (two in the illustrated example). The electronic component module 1 is mounted on an external board (not shown) using the plurality of electrical connection portions 7.

(2) Each Component of Electronic Component Module

Hereinafter, each component of the electronic component module 1 will be described with reference to the drawings.

(2.1) Board

The board 2 shown in FIG. 1A is a multilayer board having a plurality of dielectric layers and a plurality of wiring layers. The board 2 is, for example, a low temperature co-fired ceramics (LTCC) board. Further, the board 2 may be a resin board. The plurality of dielectric layers and the plurality of wiring layers are laminated in the thickness direction D1 of the board 2.

The plurality of dielectric layers has electrical insulation. The plurality of dielectric layers may be formed of the same material or some dielectric layers may be formed of a material different from other dielectric layers.

The plurality of wiring layers is formed on a plurality of dielectric layers. Each of the plurality of wiring layers is formed in a predetermined pattern. The material of the plurality of wiring layers is, for example, copper. The material of the plurality of wiring layers is not limited to copper, and may be, for example, silver or gold. The plurality of wiring layers may be formed of the same material, or some wiring layers may be formed of a material different from other wiring layers.

The board 2 has a first main surface 21 and a second main surface 22. The board 2 has a plurality of electrodes including a ground electrode. The ground electrode is electrically connected to the portion having the ground potential. Some of the plurality of wiring layers are electrically connected to the ground electrode.

(2.2) Electronic Components

As shown in FIG. 1A, the plurality of electronic components 3 is provided on the first main surface 21 of the board 2. Each of the plurality of electronic components 3 is, for example, a chip electronic component, a passive element, or an active element. The chip electronic component is, for example, a resistor, an inductor, or a capacitor. The passive element is a surface acoustic wave (SAW) filter or a bulk acoustic wave (BAW) filter. The active element is a radio frequency (RF) switch or a semiconductor element. Each electronic component 3 is provided on the first main surface 21 of the board 2. Each electronic component 3 is electrically connected to a wiring layer (not shown) of the board 2 with a plurality of electrical connection portions 31 such as a conductive bump or solder interposed therebetween. In addition, the electronic component 3 is smaller than the electronic component module 1 and as in the electronic component module 1, it may be a module component preassembled by mounting a plurality of electronic components on a board.

The plurality of electronic components 3 includes an electronic component that emits a high-frequency electromagnetic wave and an electronic component that emits a low-frequency electromagnetic wave. In the present specification, the "low frequency electromagnetic wave" means an electromagnetic wave in a frequency band of several MHz or less. In the present specification, "high-frequency electromagnetic wave" means an electromagnetic wave in a frequency band higher than a frequency of the low frequency wave (frequency included in the frequency band of several MHz or less above).

(2.3) Sealing Portion

As shown in FIG. 1A, the sealing portion 4 is provided so as to seal the plurality of electronic components 3. More specifically, the sealing portion 4 covers the first main surface 21 of the board 2 so as to seal the plurality of electronic components 3. The sealing portion 4 covers the entire periphery of each electronic component 3. That is, each electronic component 3 is disposed inside the sealing portion 4.

The material of the sealing portion 4 is a resin or the like having electrical insulation. Further, the sealing portion 4 contains, for example, a resin and a filler mixed into the resin, but the filler is not an essential component. The resin is, for example, an epoxy resin.

However, the resin is not limited to the epoxy resin, and may be, for example, an acrylic resin, a urethane resin, or a silicone resin. The filler is, for example, an inorganic filler such as silica or alumina. The sealing portion 4 may contain a black pigment such as carbon black in addition to the resin and the filler.

(2.4) Metal Layer

As shown in FIG. 1A, the metal layer 5 is provided so as to cover the sealing portion 4. More specifically, the metal layer 5 is provided so as to be in contact with part of the main surface 41 and the side face 42 of the sealing portion 4.

The metal layer 5 has a main portion 51 and a side portion 52. The main portion 51 and the side portion 52 are integrally provided. The main portion 51 is provided so as to cover the main surface 41 of the sealing portion 4. The side portion 52 is provided so as to extend from the periphery of the main portion 51 along the thickness direction D1 of the board 2. The side portion 52 is provided so as to be in contact with the side face 42 of the sealing portion 4.

The metal layer 5 is electrically connected to a wiring layer (not shown) having the ground potential of the board 2. More specifically, the side portion 52 of the metal layer 5 is in contact with the side face 23 of the board 2, and it is electrically connected to the wiring layer (not shown), of the board 2, exposed from the side face 23. The wiring layer electrically connected to the metal layer 5 is a wiring layer having a ground potential.

The metal layer 5 has high conductivity. The material of the metal layer 5 is, for example, copper. The material of the metal layer 5 may be silver or aluminum. Further, the metal layer 5 may have a structure in which a plurality of different metal materials are laminated. For example, the configuration may have a laminated structure in which a metal such as titanium, chromium, nickel, or stainless steel that easily adheres to the resin is formed on the contact face with the sealing portion 4, a highly conductive metal such as copper, silver or aluminum is formed on it, and further, a metal such as titanium, chromium, nickel or stainless steel which is hard to rust is formed on the highly conductive metal. The metal layer 5 is formed by, for example, a sputtering method.

Since the metal layer 5 is electrically connected to the wiring layer, having the ground potential, of the wiring layers of the board 2, the high-frequency shielding effect can be enhanced. On the other hand, when there is an electrically divided part in the metal layer 5, the high-frequency shielding effect is reduced, compared to the case where there is no divided part in the metal layer 5. In the present specification, the "high-frequency electromagnetic wave" refers to an electromagnetic wave in a frequency band higher than a frequency of the low-frequency, as described above.

(2.5) Magnetic Layer

As shown in FIG. 1A, the magnetic layer 6 is provided between the sealing portion 4 and the metal layer 5 in the thickness direction D1 of the board 2.

The magnetic layer 6 has a high magnetic permeability. As a result, the magnetic layer 6 can enhance the shielding effect of low frequencies. In the present specification, the "low frequency electromagnetic wave" refers to an electromagnetic wave in a frequency band of several MHz or less, as described above.

(2.6) Electrical Connection Portion

As shown in FIG. 1A, the plurality of electrical connection portions 7 are provided on the second main surface 22 of the board 2. Each electrical connection portion 7 is electrically connected to the wiring layer (not shown) of the board 2, and is a member that electrically connects the wiring layer to an external board (not shown). Each electrical connection portion 7 is a conductive bump. The material of each electrical connection portion 7 is, for example, a metal or an alloy.

(2.7) Details of Magnetic Layer

Figure 2A:
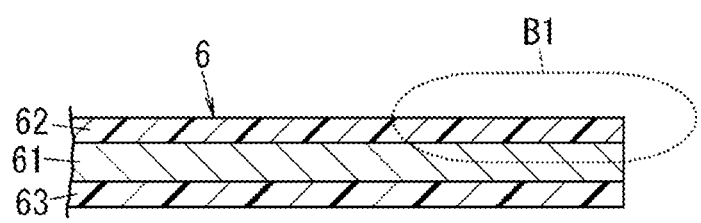
FIG. 2A is a cross-sectional view of part of the magnetic layer in the electronic component module according to the first embodiment.

As shown in FIG. 2A, the magnetic layer 6 includes a magnetic main body 61, a first cover sheet 62, and a second cover sheet 63.

The magnetic main body 61 is provided between the first cover sheet 62 and the second cover sheet 63 in the thickness direction D1 of the board 2. The magnetic main body 61 has magnetism. The material of the magnetic main body 61 is a magnetic metal having soft magnetic properties. The magnetic metal is, for example, iron, nickel, cobalt, or an iron-nickel alloy. The form of the magnetic main body 61 includes amorphous, nanocrystals, and sintered bodies, and the shape of the magnetic main body 61 includes a foil, a bulk sheet, a resin sheet containing a magnetic material filler, and the like. The material of the magnetic main body 61 is generally more brittle than the material of the metal layer 5. The thickness of the magnetic main body 61 is, for example, 30 µm. The thickness of the magnetic main body 61 is preferably 20 µm or more and 40 µm or less.

The first cover sheet 62 is provided between the magnetic main body 61 and the metal layer 5 in the thickness direction D1 of the board 2. The first cover sheet 62 has a first main surface 621 and a second main surface 622. The first main surface 621 is in contact with the magnetic main body 61 in the thickness direction D1 of the board 2. The second main surface 622 is in contact with the metal layer 5 in the thickness direction D1 of the board 2. In other words, the first main surface 621 faces the magnetic main body 61 in the thickness direction D1 of the board 2. Here, "the first main surface 621 facing the magnetic main body 61 in the thickness direction D1 of the board 2" includes a case where the first main surface 621 is in contact with the magnetic main body 61 in the thickness direction D1 of the board 2, and a case where the first main surface 621 faces the magnetic main body 61 with another member interposed therebetween in the thickness direction D1 of the board 2. Further, the second main surface 622 faces the metal layer 5 in the thickness direction D1 of the board 2. Here, "the second main surface 622 facing the metal layer 5 in the thickness direction D1 of the board 2" includes a case where the second main surface 622 is in contact with the metal layer 5 in the thickness direction D1 of the board 2, and a case where the second main surface 622 faces the metal layer 5 with another member interposed therebetween in the thickness direction D1 of the board 2.

The first cover sheet 62 includes a substrate 64, a black resin layer 65, and an adhesive layer 66. The thickness of the first cover sheet 62 is 10 µm or less.

The substrate 64 is provided between the black resin layer 65 and the adhesive layer 66. The substrate 64 preferably has heat resistance. The material of the substrate 64 is, for example, polyimide. The material of the substrate 64 is not limited to polyimide, and may be another synthetic resin. The material of the substrate 64 may be, for example, polyethylene terephthalate. The substrate 64 preferably has heat resistance, and is preferably polyimide from the viewpoint of heat resistance.

The black resin layer 65 is provided between the substrate 64 and the metal layer 5.

The adhesive layer 66 is provided to bond the first cover sheet 62 to the magnetic main body 61. The adhesive layer 66 has elasticity. The material of the adhesive layer 66 is a material having heat resistance. The material of the adhesive layer 66 is, for example, a material in which a rubber component is added to an epoxy resin. Other materials may be silicone-based or acrylic-based.

The second cover sheet 63 is provided between the sealing portion 4 and the magnetic main body 61. The thickness of the second cover sheet 63 is 10 µm or less. Although not shown, the second cover sheet 63 includes a substrate, a first adhesive layer, and a second adhesive layer.

The substrate is provided between the first adhesive layer and the second adhesive layer in the thickness direction D1 of the board 2. The first adhesive layer is a layer for adhering the magnetic layer 6 to the sealing portion 4. The second adhesive layer is a layer for adhering the second cover sheet 63 to the magnetic main body 61.

Figure 1B:
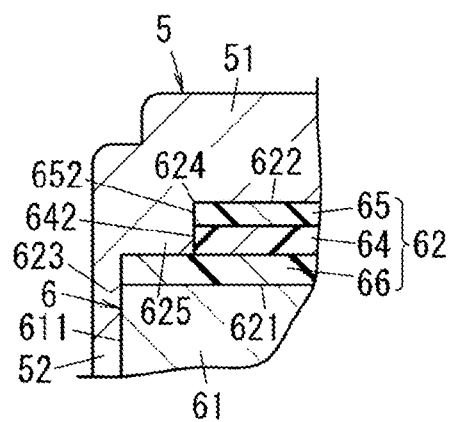
FIG. 1B is an enlarged view of the region A1 of FIG. 1A in the electronic component module.
Figure 1C:
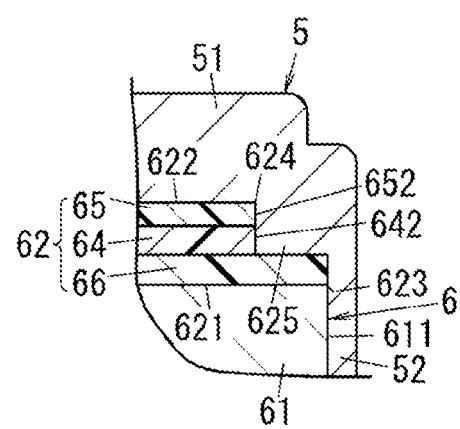
FIG. 1C is an enlarged view of the region A2 of FIG. 1A in the electronic component module.
Figure 2B:
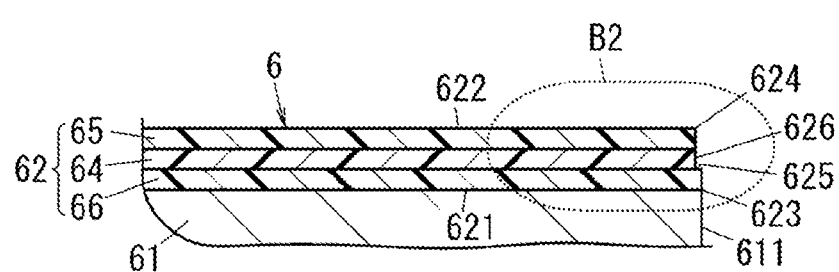
FIG. 2B is an enlarged view of the region B1 of FIG. 2A in the magnetic layer.
Figure 2C:
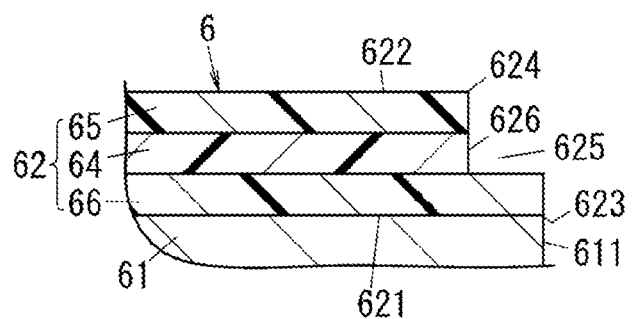
FIG. 2C is an enlarged view of the region B2 of FIG. 2B in the magnetic layer.

In the magnetic layer 6 having the above configuration, as shown in FIGS. 1B, 1C, and 2C, the substrate 64 and the black resin layer 65 of the first cover sheet 62 are located inside the magnetic main body 61. More specifically, in plan view from the thickness direction D1 of the board 2, the side face 642 of the substrate 64 and the side face 652 of the black resin layer 65 are located inside the side face 611 of the magnetic main body 61. In other words, in the example in FIG. 1C, the magnetic layer 6 has a step 625 between the magnetic main body 61, and the substrate 64 and the black resin layer 65 of the first cover sheet 62.

In other words, in the first cover sheet 62 of the magnetic layer 6, the second outer peripheral end 624 of the second main surface 622 is located inside the first outer peripheral end 623 of the first main surface 621. Specifically, in the example of FIG. 2C, the first cover sheet 62 has a step 625 so that the second outer peripheral end 624 of the second main surface 622 is located inside the first outer peripheral end 623 of the first main surface 621.

When the magnetic layer 6 has the above shape, since the metal layer 5 is provided on the magnetic layer 6 as shown in FIGS. 1B and 1C, it is possible to reduce the occurrence that the metal layer 5 is divided at the corner of the magnetic layer 6. As a result, the metal layer 5 is less likely to be divided, and the metal layer 5 is electrically integrated. For example, it is possible to reduce the occurrence that the metal layer 5 is divided between the main portion 51 and the side portion 52 and also the occurrence that a part of the side portion 52 which is in contact with the magnetic layer 6 is divided. As a result, since the shield of the electronic component module 1 can be stably set to the ground potential, it is possible to suppress the reduction in the shielding effect of the metal layer 5.

In the example of FIG. 1A, the magnetic layer 6 is provided in part between the sealing portion 4 and the metal layer 5 in the thickness direction D1 of the board 2. In other words, in the electronic component module 1, there is a region in which the magnetic layer 6 is not provided between the sealing portion 4 and the metal layer 5. As a result, the cost can be reduced because it is only required to provide the magnetic layer 6 at the necessary location.

Figure 3A:
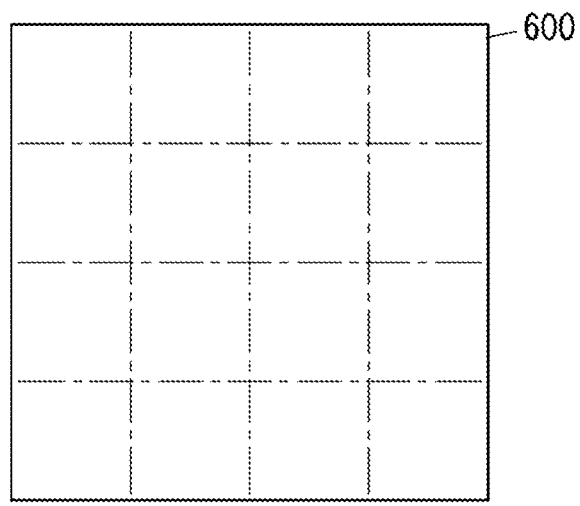
FIGS. 3A and 3B are front views for explaining the method of manufacturing the electronic component module according to the first embodiment.
Figure 3B:
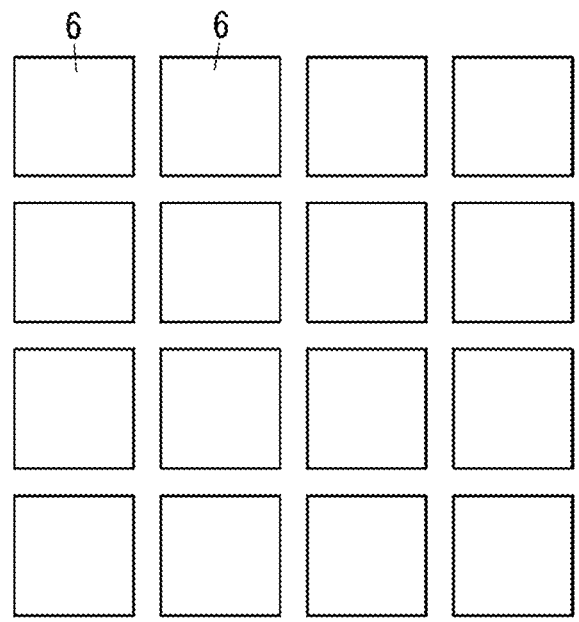

The magnetic layer 6 is formed by cutting a magnetic sheet 600 as shown in FIGS. 3A and 3B. The magnetic sheet 600 includes a magnetic main body that is the base of the magnetic main body 61, a first sheet body that is the base of the first cover sheet 62, and a second sheet body that is the base of the second cover sheet 63. The material of the magnetic main body is the same as the material of the magnetic main body 61. The material of the first sheet body is the same as the material of the first cover sheet 62. The material of the second sheet body is the same as the material of the second cover sheet 63.

In the first embodiment, the magnetic sheet 600 is cut by a laser. In cutting with a laser, the heat generated from the laser beam causes the first cover sheet 62 of the magnetic layer 6 to shrink. Furthermore, by cutting with a laser, the irregularities of the side face 626 (cut face, see FIG. 2C) of the first cover sheet 62 of the magnetic layer 6 can be reduced. Specifically, when the magnetic sheet 600 is cut by a YAG laser or a UV laser, the irregularities of the side face 626 of the first cover sheet 62 of the magnetic layer 6 can be reduced when the substrate 64 of the first cover sheet 62 is polyimide.

Further, by cutting the magnetic sheet 600 with a laser, the irregularities of the side face 611 (cut face) of the magnetic main body 61 of the magnetic layer 6 together with the side face 626 of the first cover sheet 62 can also be reduced. Specifically, when the magnetic sheet 600 is cut by a YAG laser or a UV laser, the irregularities of the side face 611 of the magnetic main body 61 of the magnetic layer 6 can be reduced.

(3) Manufacturing Method of Electronic Component Module

Hereinafter, the method of manufacturing the electronic component module 1 will be described with reference to FIGS. 3A, 3B, and 4A to 4F. The electronic component module 1 is manufactured by performing the first to eighth processes.

In the first process, as shown in FIG. 3A, the magnetic sheet 600 which is the base of the magnetic layer 6 (see FIG. 1A) is prepared.

In the second process, as shown in FIGS. 3A and 3B, the magnetic sheet 600 is cut to form a plurality of (12 in the illustrated example) magnetic layers 6. The magnetic sheet 600 is cut along the one-dot chain line in FIG. 3A.

At this time, as shown in FIG. 2C, in the first cover sheet 62, the magnetic sheet 600 is cut to form a plurality of magnetic layers 6 so that the second outer peripheral end 624 of the second main surface 622 is located inside the first outer peripheral end 623 of the first main surface 621. In the first embodiment, the magnetic sheet 600 is cut with a laser to form the plurality of magnetic layers 6. As the laser, for example, a YAG laser or a UV laser is used.

Figure 4A:
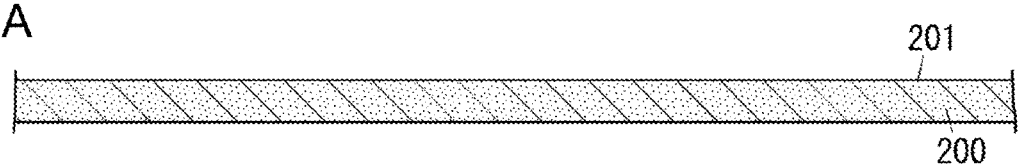
FIGS. 4A to 4F are process sectional views for explaining the method of manufacturing the electronic component module according to the first embodiment.

In the third process, the board 2 (see FIG. 1A) is prepared. More specifically, as shown in FIG. 4A, a board main body 200 that is the base of each board 2 of the plurality of electronic component modules 1 is prepared. The board main body 200 is provided with a patterned metal (not shown) on the main surface 201.

Figure 4B:
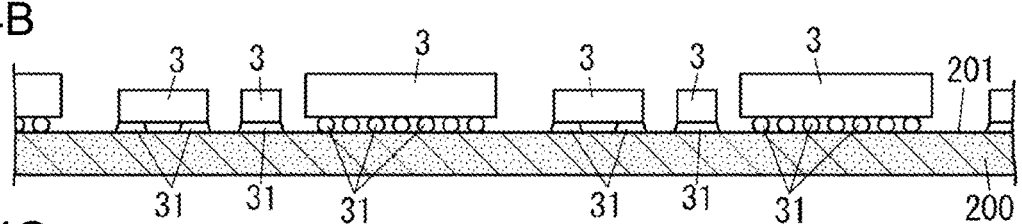

In the fourth process, the electronic component 3 is provided on the board 2. More specifically, as shown in FIG. 4B, the plurality of electronic components 3 is mounted on the board main body 200. The plurality of electronic components 3 is fixed on the main surface 201 of the board main body 200 using the electrical connection portion 31 such as a conductive bump or solder.

Figure 4C:
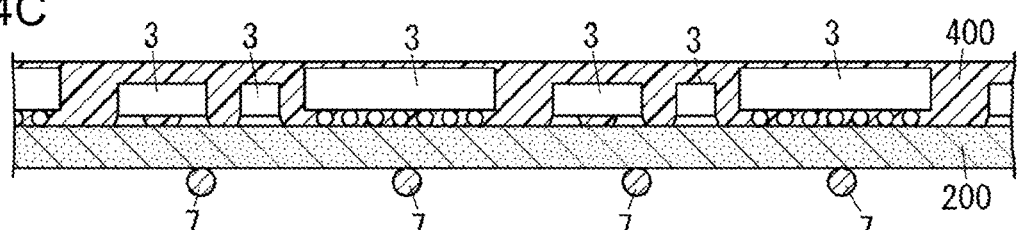

In the fifth process, the sealing portion 4 (see FIG. 1A) that seals the electronic component 3 is provided. More specifically, as shown in FIG. 4C, a sealing main body 400, which is the base of the sealing portion 4 that seals the plurality of electronic components 3 provided on the board main body 200, is formed. Using the resin that is the material of the sealing main body 400, the sealing main body 400 is formed so as to cover all of the plurality of electronic components 3. Further, in the fifth process, the plurality of (four in the illustrated example) electrical connection portions 7 is provided on the board 2.

Figure 4D:
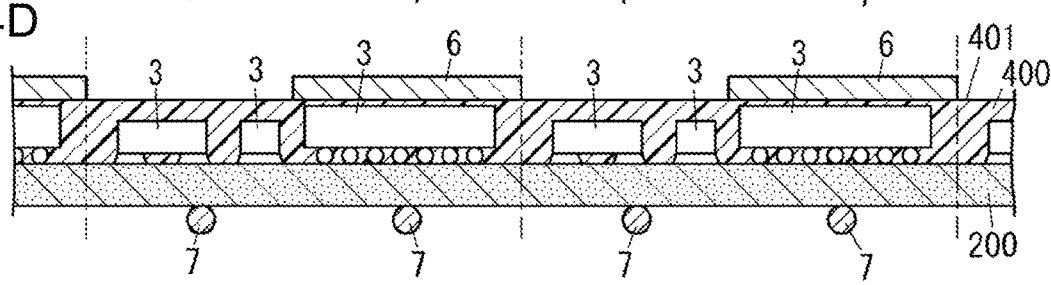

In the sixth process, the magnetic layer 6 is provided on part of the main surface 41 (see FIG. 1A) of the sealing portion 4 (see FIG. 1A). More specifically, as shown in FIG. 4D, the plurality of (two in the illustrated example) magnetic layers 6 formed by cutting the magnetic sheet 600 in the second process is attached to the main surface 401 of the sealing main body 400 using the second adhesive layer (not shown) of the second cover sheet 63 (see FIG. 2A) of each magnetic layer 6. As a result, the magnetic layer 6 is formed on the main surface 401 of the sealing main body 400.

Figure 4E:
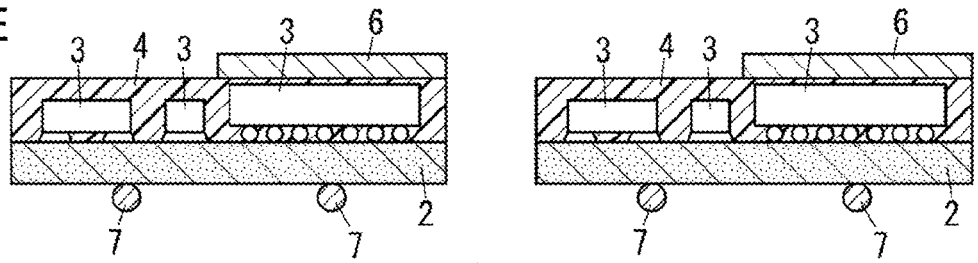

In the seventh process, as shown in FIGS. 4D and 4E, the board main body 200 and the sealing main body 400 are cut. More specifically, for example, a laser is used to cut the board main body 200 and the sealing main body 400. The board main body 200 and the sealing main body 400 are cut along the one-dot chain line shown in FIG. 4D. When cutting the board main body 200 and the sealing main body 400, the magnetic sheet 600 is not cut so that the cross-sectional shape of FIG. 2C is maintained. Cutting with a dicing machine may be used as another cutting method.

Figure 4F:
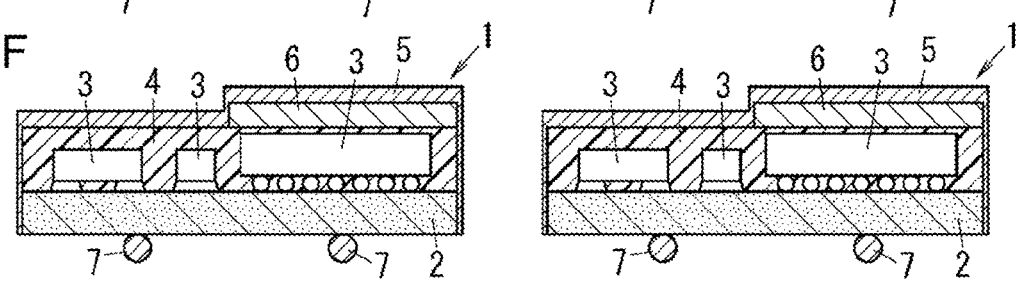

In the eighth process, as shown in FIG. 4F, the metal layer 5 is provided so as to cover the sealing portion 4 and the magnetic layer 6. More specifically, the metal layer 5 is formed by sputtering. The method of forming the metal layer 5 is not limited to sputtering. The metal layer 5 may be formed, for example, by vapor deposition, plating, silver paste, or spray.

The electronic component module 1 can be manufactured by performing the first to eighth processes. The first process and the second process may be performed before the sixth process, and may be performed in parallel with at least one of the third to fifth processes.

(4) Effect

In the first cover sheet 62 of the magnetic layer 6 of electronic component module 1, the second outer peripheral end 624 of the second main surface 622 is located inside the first outer peripheral end 623 of the first main surface 621. As a result, the metal layer 5 can be continuously formed on the magnetic layer 6, so that stable conduction can be obtained in the metal layer 5. In other words, the metal layer 5 can be formed on the magnetic layer 6 without being divided, and stable conduction can be obtained.

In the electronic component module 1, the magnetic layer 6 is provided in part between the sealing portion 4 and the metal layer 5. As a result, the cost can be reduced because it is only required to provide the magnetic layer 6 at the necessary location.

In the electronic component module 1, the first cover sheet 62 has a step 625. As a result, the metal layer 5 can be easily formed continuously, so that more stable conduction can be obtained in the metal layer 5.

In the method of manufacturing the electronic component module 1, in the first cover sheet 62 of the magnetic layer 6, the magnetic sheet 600 is cut to form the magnetic layer 6 so that the second outer peripheral end 624 of the second main surface 622 is located inside the first outer peripheral end 623 of the first main surface 621. As a result, the metal layer 5 can be continuously formed, so that stable conduction can be obtained in the metal layer 5.

In the method of manufacturing the electronic component module 1, the magnetic sheet 600 is cut with a YAG laser or a UV laser to form the magnetic layer 6. As a result, since the first cover sheet 62 can be contracted by the heat of the laser beam, the metal layer 5 can be easily formed continuously.

(5) Modification

Hereinafter, a modification of the first embodiment will be described.

As the first modification of the first embodiment, in the method of manufacturing the electronic component module 1, the magnetic layer 6 may be provided on the sealing portion 4 after cutting the board main body 200 and the sealing main body 400. In this case, the electronic component module 1 is manufactured by performing the first to eighth processes shown in FIGS. 3A, 3B, and 5A to 5F.

As in the first process of the first embodiment, in the first process, as shown in FIG. 3A, the magnetic sheet 600 which is the base of the magnetic layer 6 is prepared. As in the second process of the first embodiment, in the second process, as shown in FIGS. 3A and 3B, the magnetic sheet 600 is cut to form the magnetic layer 6.

Figure 5A:
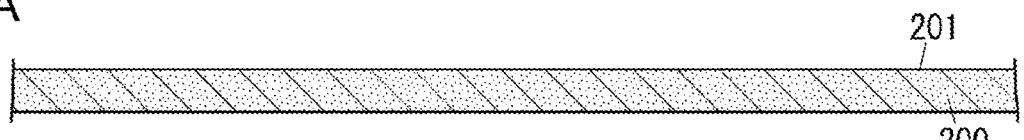
FIGS. 5A to 5F are process sectional views for explaining the method of manufacturing the electronic component module according to the first modification of the first embodiment.
Figure 5B:
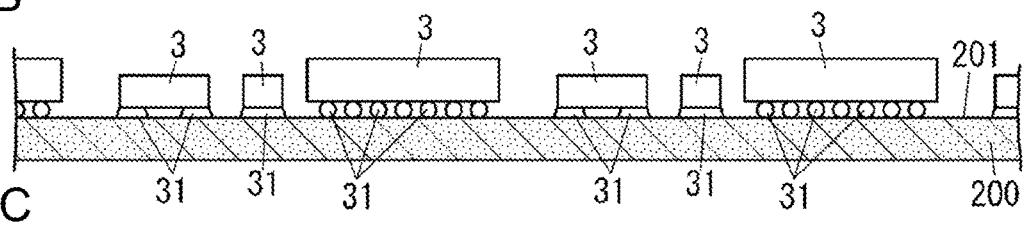

As in the third process of the first embodiment, in the third process, as shown in FIG. 5A, the board main body 200 that is the base of each board 2 of the plurality of electronic component modules 1 is prepared. As in the fourth process of the first embodiment, in the fourth process, as shown in FIG. 5B, the plurality of electronic components 3 is provided on the board main body 200. As in the fifth process of the first embodiment, in the fifth process, as shown in FIG. 5C, the sealing main body 400 that seals the plurality of electronic components 3 and the plurality of electrical connection portions 7 are formed.

Figure 5C:
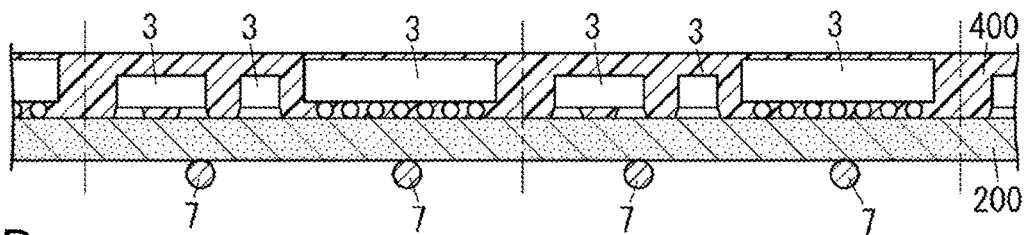
Figure 5D:
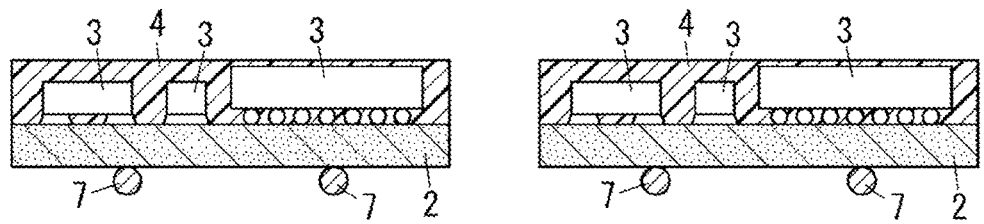

In the sixth process, as shown in FIGS. 5C and 5D, the board main body 200 and the sealing main body 400 are cut. More specifically, for example, a laser is used to cut the board main body 200 and the sealing main body 400. The board main body 200 and the sealing main body 400 are cut along the one-dot chain line shown in FIG. 5C.

Figure 5E:
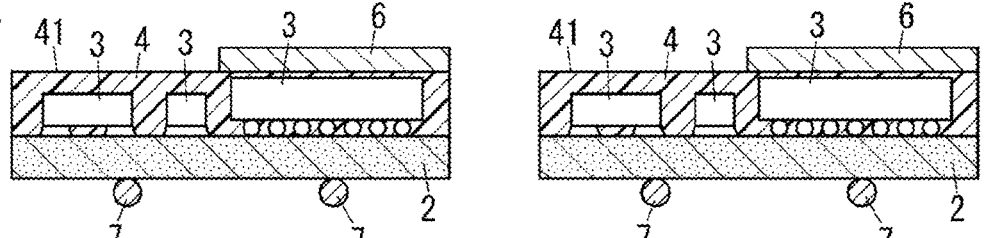

In the seventh process, as shown in FIG. 5E, the magnetic layer 6 is formed on the main surface 41 of the sealing portion 4. More specifically, the magnetic layer 6 formed by cutting the magnetic sheet 600 in the second process is attached to the main surface 41 of the sealing portion 4, which is the base of the sealing portion 4, using the second adhesive layer (not shown) of the second cover sheet 63 of the magnetic layer 6 to form the magnetic layer 6 on the main surface 41 of the sealing portion 4.

Figure 5F:
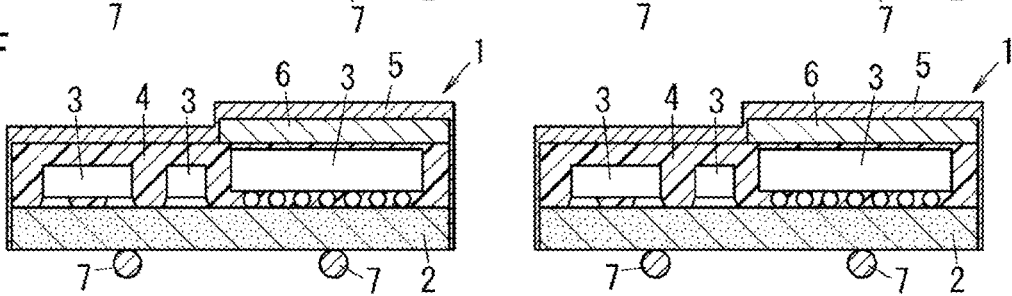

As in the eighth process of the first embodiment, in the eighth process, as shown in FIG. 5F, the metal layer 5 is formed.

In the method of manufacturing the electronic component module 1 according to the first modification, the electronic component module 1 can be manufactured by performing the first to eighth processes.

As the second modification of the first embodiment, as shown in FIG. 6A, the electronic component module 1a may include a magnetic layer 6a and a metal layer 5a instead of the magnetic layer 6 and the metal layer 5.

The magnetic layer 6a is provided in the entire region between the sealing portion 4 and the metal layer 5a in the thickness direction D1 of the board 2. In the electronic component module 1a according to the second modification, the magnetic layer 6a has a step 625 as shown in FIGS. 6B and 6C.

The metal layer 5a includes a main portion 51a and a side portion 52a, as in the metal layer 5 of the first embodiment. The main portion 51a and the side portion 52a are integrally provided. As described above, since the magnetic layer 6a is provided in the entire region between the sealing portion 4 and the metal layer 5a (the region between the sealing portion 4 and the main portion 51a of the metal layer 5a), main portion 51a has no step and is flat, compared to the main portion 51.

The electronic component modules 1, 1a and the methods of manufacturing the electronic component modules 1, 1a according to the above first and second modifications have the same effects as the electronic component module 1 and the method of manufacturing the electronic component module 1 according to the first embodiment.

Second Embodiment

The electronic component module 1 according to the second embodiment differs from the electronic component module 1 according to the first embodiment in that it includes a magnetic layer 6b as shown in FIG. 7 instead of the magnetic layer 6. The constituent elements of the electronic component module 1 according to the second embodiment which are the same as those of the electronic component module 1 according to the first embodiment are given the same reference numerals, and the description thereof will be omitted.

As shown in FIG. 7, the electronic component module 1 according to the second embodiment includes the magnetic layer 6b. As in the electronic component module 1 according to the first embodiment, the electronic component module 1 according to the second embodiment includes the board 2, the plurality of electronic components 3, the sealing portion 4, and the metal layer 5 (see FIG. 1A).

The magnetic layer 6b includes a magnetic main body 61b, a first cover sheet 62b, and a second cover sheet 63b. The magnetic main body 61b is provided between the first cover sheet 62b and the second cover sheet 63b. The configuration and function of the magnetic layer 6b of the second embodiment which are the same as those of the magnetic layer 6 of the first embodiment (see FIGS. 2A to 2C) will be omitted.

The first cover sheet 62b has the first main surface 621, the second main surface 622, and the side face 626, and further has an inclined face 627 between the second main surface 622 and the side face 626.

The inclined face 627 is a face at which the outer peripheral end is located inside as the outer peripheral end is positioned closer to the second main surface 622 than to the first main surface 621. In the example of FIG. 7, the inclined face 627 is a convex curved face. That is, in the first cover sheet 62, the boundary region between the second main surface 622 and the side face 626 is rounded.

With the magnetic layer 6b having the above shape, when the metal layer 5 is provided on the magnetic layer 6b, it is possible to reduce the occurrence that a part of the metal layer 5 is divided. It is possible to suppress a decrease in the shielding effect of the metal layer 5.

In the method of manufacturing the electronic component module 1 according to the second embodiment, the magnetic sheet 600 (see FIG. 3A) is cut by a cemented carbide mold instead of a laser. The cemented carbide mold is formed in a grid pattern. The magnetic sheet 600 is cut by pushing the cemented carbide mold from the first sheet body side (front side in FIG. 3A) of the magnetic sheet 600.

By cutting the magnetic sheet 600 with a cemented carbide mold as described above to form the magnetic layer 6b, the inclined face 627, which is a convex curved face, can be formed on the first cover sheet 62b.

In the electronic component module 1 according to the second embodiment, the first cover sheet 62 has an inclined face 627 which is a convex curved face. As a result, the metal layer 5 can be easily formed continuously, so that more stable conduction can be obtained in the metal layer 5.

In the method of manufacturing the electronic component module 1 according to the second embodiment, the magnetic sheet 600 is cut with a cemented carbide mold (not shown) to form the magnetic layer 6b. As a result, the first cover sheet 62 can easily have a convex curved face at which the outer peripheral end is located inside as the outer peripheral end is positioned closer to the second main surface 622 than to the first main surface 621, so that the metal layer 5 can be easily continuously formed.

As the first modification of the second embodiment, as in the first modification of the first embodiment, in the method of manufacturing the electronic component module 1, after cutting the board main body 200 and the sealing main body 400, the magnetic layer 6b may be provided on the sealing portion 4.

Further, as the second modification of the second embodiment, as in the second modification of the first embodiment, in the electronic component module 1, the magnetic layer 6b may be provided in the entire region between the sealing portion 4 and the metal layer 5. The magnetic layer 6b also has the step 625 in the electronic component module 1 according to the second modification.

The electronic component module 1 and the method of manufacturing the electronic component module 1 according to each of the above modifications also has the same effect as the electronic component module 1 and the method of manufacturing the electronic component module 1 according to the second embodiment.

Third Embodiment

Figure 8A:
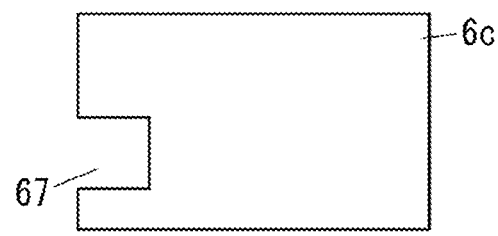
FIG. 8A is a front view of the magnetic layer in the electronic component module according to the third embodiment.

The electronic component module 1 according to the third embodiment differs from the electronic component module 1 according to the first embodiment in that it includes a magnetic layer 6c as shown in FIG. 8A instead of the magnetic layer 6. The constituent elements of the electronic component module 1 according to the third embodiment which are the same as those of the electronic component module 1 according to the first embodiment are given the same reference numerals, and the description thereof will be omitted.

The electronic component module 1 according to the third embodiment includes the magnetic layer 6c as shown in FIG. 8A. As in the electronic component module 1 according to the first embodiment, the electronic component module 1 according to the third embodiment includes the board 2, the plurality of electronic components 3, the sealing portion 4, and the metal layer 5 (see FIG. 1A).

The magnetic layer 6c has a recess 67 in plan view from the thickness direction of the magnetic layer 6c. In other words, when the magnetic layer 6c is provided between the sealing portion 4 (see FIG. 1A) and the metal layer 5 (see FIG. 1A), it has the recess 67 in plan view from the thickness direction D1 of the board 2. Depending on the electronic component 3, there is a case where the shielding effect of the magnetic layer 6c may not be needed. Alternatively, there is another case where the electronic component 3 and another component may be made conductive from the upper face side. In these cases, in the thickness direction D1 of the board 2 (see FIG. 1A), the recess 67 of the magnetic layer 6c is formed at a position overlapping with the corresponding electronic component 3. The configuration and function of the magnetic layer 6c of the third embodiment which are the same as those of the magnetic layer 6 of the first embodiment (see FIG. 1A) will be omitted.

In the electronic component module 1 according to the third embodiment, as described above, the magnetic layer 6c has the recess 67. This can deal with the case where there is a region that does not require the magnetic shield.

Figure 8B:
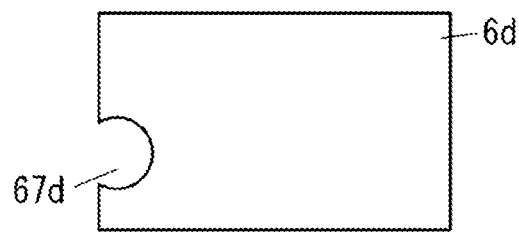
FIG. 8B is a front view of the magnetic layer in the electronic component module according to the first modification of the third embodiment.

As the first modification of the third embodiment, the electronic component module 1 may include a magnetic layer 6d as shown in FIG. 8B instead of the magnetic layer 6c. The magnetic layer 6d has an arcuate recess 67d in plan view from the thickness direction of the magnetic layer 6d. In other words, when the magnetic layer 6d is provided between the sealing portion 4 (see FIG. 4A) and the metal layer 5 (see FIG. 1A), it has the arcuate recess 67d in plan view from the thickness direction D1 of the board 2. As in the third embodiment, this can deal with the case where there is a region that does not require the magnetic shield.

Figure 8C:
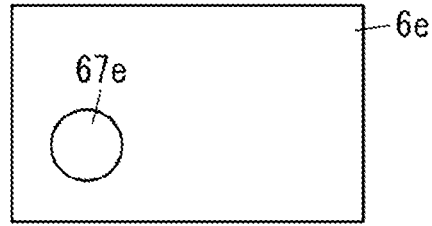
FIG. 8C is a front view of the magnetic layer in the electronic component module according to the second modification of the third embodiment.

As the second modification of the third embodiment, the electronic component module 1 may include a magnetic layer 6e as shown in FIG. 8C instead of the magnetic layer 6c. The magnetic layer 6e has a through hole 67e in plan view from the thickness direction of the magnetic layer 6e. In other words, when the magnetic layer 6e is provided between the sealing portion 4 (see FIG. 1A) and the metal layer 5 (see FIG. 1A), it has the through hole 67e in plan view from the thickness direction D1 of the board 2. The through hole 67e penetrates the magnetic layer 6e in the thickness direction. In the magnetic layer 6e, the first cover sheet 62, the magnetic main body 61, and the second cover sheet 63 are provided side by side in the thickness direction of the magnetic layer 6e. As in the third embodiment, this can deal with the case where there is a region that does not require the magnetic shield.

The electronic component module 1 and the method of manufacturing the electronic component module 1 according to each of the above modifications also has the same effect as the electronic component module 1 and the method of manufacturing the electronic component module 1 according to the third embodiment.

In the electronic component modules 1, 1a according to the first to third embodiments and their modifications, printing may be performed on the magnetic layer 6. The printing is, for example, laser printing. Specifically, printing is performed on the black resin layer.

The embodiments and modifications described above are only part of various embodiments and modifications of the present disclosure. Further, the embodiments and modifications can be variously changed according to the design and the like as long as the object of the present disclosure can be achieved.

(Aspects)

The following aspects are disclosed from the above-described embodiments and modifications.

The electronic component module (1; 1a) according to the first aspect includes the board (2), the electronic component (3), the sealing portion (4), the metal layer (5; 5a), and the magnetic layer (6; 6a; 6b; 6c; 6d; 6e). The board (2) has the main surface (first main surface 21). The electronic component (3) is provided on the main surface (first main surface 21) of the board (2). The sealing portion (4) seals the electronic component (3). The metal layer (5; 5a) covers the sealing portion (4). The magnetic layer (6) is provided between the sealing portion (4) and the metal layer (5; 5a). The magnetic layer (6) includes the magnetic main body (61; 61b) and the cover sheet (first cover sheet 62; 62b). The cover sheet (first cover sheet 62; 62b) is provided between the magnetic main body (61; 61b) and the metal layer (5; 5a). The cover sheet (first cover sheet 62; 62b) has the first main surface (621) and the second main surface (622). The first main surface (621) faces the magnetic main body (61; 61b). The second main surface (622) faces the metal layer (5; 5a). The outer peripheral end (second outer peripheral end 624) of the second main surface (622) is located inside the outer peripheral end (first outer peripheral end 623) of the first main surface (621).

According to the electronic component module (1; 1a) according to the first aspect, since the metal layer (5; 5a) can be continuously formed on the magnetic layer (6; 6a; 6b; 6c; 6d; 6e), stable conduction can be obtained in the metal layer (5; 5a).

In the electronic component module (1) according to the second aspect, in the first aspect, the magnetic layer (6; 6b; 6c; 6d; 6e) is provided in part of the sealing portion (4).

According to the electronic component module (1) according to the second aspect, since it is only required to provide the magnetic layer (6; 6b; 6c; 6d; 6e) at the necessary location, the cost can be reduced.

In the electronic component module (1) according to the third aspect, in the first or second aspect, the magnetic layer (6c; 6d; 6e) has the recess (67; 67d) or the through hole (67e) in plan view from the thickness direction (D1) of the board (2).

The electronic component module (1) according to the third aspect can deal with the case where there is a region that does not require the magnetic shield.

In the electronic component module (1; 1a) according to the fourth aspect, in any one of the first to third aspects, the cover sheet (first cover sheet 62) has a step (625) so that the outer peripheral end (second outer peripheral end 624) of the second main surface (622) is located inside the outer peripheral end (first outer peripheral end 623) of the first main surface (621).

According to the electronic component module (1; 1a) according to the fourth aspect, since the metal layer (5; 5a) can be easily formed continuously, further stable conduction can be obtained.

In the electronic component module (1) according to the fifth aspect, in any one of the first to third aspects, the cover sheet (first cover sheet 62b) has the inclined face (627) at which the outer peripheral end is located inside as the outer peripheral end is positioned closer to the second main surface (622) than to the first main surface (621).

According to the electronic component module (1) according to the fifth aspect, since the metal layer (5) can be easily formed continuously, further stable conduction can be obtained in the metal layer (5).

In the electronic component module (1) according to the sixth aspect, in the fifth aspect, the inclined face (627) is a convex curved face.

According to the electronic component module (1) according to the sixth aspect, since it is easier to form the metal layer (5) continuously, further stable conduction can be obtained in the metal layer (5).

The method of manufacturing the electronic component module (1; 1a) according to the seventh aspect includes preparing the board (2) and providing the electronic component (3) on the board (2). The method of manufacturing the electronic component module (1) includes providing the sealing portion (4) that seals the electronic component (3) and cutting the magnetic sheet (600) to form the magnetic layer (6; 6a; 6b; 6c; 6d; 6e). The method of manufacturing the electronic component module (1) includes providing the magnetic layer (6; 6a; 6b; 6c; 6d; 6e) on at least part of the sealing portion (4). The method of manufacturing the electronic component module (1; 1a) includes providing the metal layer (5; 5a) so as to cover the sealing portion (4) and the magnetic layer (6; 6a; 6b; 6c; 6d; 6e). The magnetic layer (6; 6a; 6b; 6c; 6d; 6e) includes the magnetic main body (61; 61b) and the cover sheet (first cover sheet 62; 62b). The cover sheet (first cover sheet 62; 62b) is provided between the magnetic main body (61; 61b) and the metal layer (5; 5a). The cover sheet (first cover sheet 62; 62b) has the first main surface (621) and the second main surface (622). The first main surface (621) faces the magnetic main body (61; 61b). The second main surface (622) faces the metal layer (5; 5a). The forming of the magnetic layer (6; 6a; 6b; 6c; 6d; 6e) includes cutting the magnetic sheet (600) to form the magnetic layer (6; 6a; 6b; 6c; 6d; 6e) so that the outer peripheral end (second outer peripheral end 624) of the second main surface (622) is located inside the outer peripheral end (first outer peripheral end 623) of the first main surface (621).

According to the method of manufacturing the electronic component module (1; 1a) according to the seventh aspect, since the metal layer (5; 5a) can be formed continuously, stable conduction can be obtained in the metal layer (5; 5a).

In the electronic component module (1; 1a) according to the eighth aspect, in the seventh aspect, the forming of the magnetic layer (6; 6a; 6c; 6d; 6e) includes cutting the magnetic sheet (600) with a YAG laser or a UV laser to form the magnetic layer (6; 6a; 6c; 6d; 6e).

According to the method of manufacturing the electronic component module (1; 1a) according to the eighth aspect, since the cover sheet (first cover sheet 62) can be contracted by the heat of the laser beam, it is possible to facilitate the continuous formation of the metal layer (5; 5a).

In the electronic component module (1) according to the ninth aspect, in the seventh aspect, the forming of the magnetic layer (6b) includes cutting the magnetic sheet (600) with a cemented carbide mold to form the magnetic layer (6b).

According to the method of manufacturing the electronic component module (1) according to the ninth aspect, since a convex curved face at which the outer peripheral end is located inside can be formed easily in the cover sheet (first cover sheet 62; 62b) as the outer peripheral end is positioned closer to the second main surface (622) than to the first main surface (621), it is possible to facilitate the continuous formation of the metal layer (5; 5a).

1,1a: Electronic component module
2: Board
21: First main surface
3: Electronic component
4: Sealing portion
5,5a: Metal layer
6,6a,6b,6c,6d,6e: Magnetic layer
61,61b: Magnetic main body
62,62b: First cover sheet
621: First main surface
622: Second main surface
623: First outer peripheral end
624: Second outer peripheral end
625: Step
627: Inclined face
67,67d: Recess
67e: Through hole
600: Magnetic sheet
D1: Thickness direction

The invention claimed is:

1. An electronic component module comprising:
a board having a main surface;
an electronic component provided on the main surface of the board;
a sealing portion sealing the electronic component;
a metal layer covering the sealing portion; and
a magnetic layer provided between the sealing portion and the metal layer,
wherein the magnetic layer includes a magnetic main body and a cover sheet provided between the magnetic main body and the metal layer,
wherein the cover sheet has a first main surface facing the magnetic main body and a second main surface facing the metal layer,
wherein an outer peripheral end of the second main surface is located inside an outer peripheral end of the first main surface, and
wherein the cover sheet has a step so that the outer peripheral end of the second main surface is located inside the outer peripheral end of the first main surface.

2. The electronic component module according to claim 1, wherein the magnetic layer is provided on a part of the sealing portion.

3. The electronic component module according to claim 1, wherein the magnetic layer has a recess or a through hole in plan view from a thickness direction of the board.

4. The electronic component module according to claim 1, wherein the step is an inclined face.

5. The electronic component module according to claim 2, wherein the magnetic layer has a recess or a through hole in plan view from a thickness direction of the board.

6. The electronic component module according to claim 2, wherein the step is an inclined face.

7. The electronic component module according to claim 3, wherein the step is an inclined face.

8. The electronic component module according to claim 4, wherein the inclined face is a convex curved face.

9. A method of manufacturing an electronic component module, the method comprising:
preparing a board;
providing an electronic component on the board;
providing a sealing portion sealing the electronic component;
cutting a magnetic sheet to form a magnetic layer;
providing the magnetic layer on at least a part of the sealing portion; and
providing a metal layer so as to cover the sealing portion and the magnetic layer,
wherein the magnetic layer includes a magnetic main body and a cover sheet provided between the magnetic main body and the metal layer,
wherein the cover sheet has a first main surface facing the magnetic main body and a second main surface facing the metal layer,
wherein the forming of the magnetic layer includes cutting the magnetic sheet to form the magnetic layer so that an outer peripheral end of the second main surface is located inside an outer peripheral end of the first main surface, and
wherein the cover sheet has a step so that the outer peripheral end of the second main surface is located inside the outer peripheral end of the first main surface.

10. The method of manufacturing the electronic component module according to claim 9, wherein the forming of the magnetic layer includes cutting the magnetic sheet with a YAG laser or a UV laser to form the magnetic layer.

11. The method of manufacturing an electronic component module according to claim 9, wherein the forming of the magnetic layer includes cutting the magnetic sheet with a cemented carbide mold to form the magnetic layer.

* * * * *